(12) United States Patent
Miyajima

(10) Patent No.: US 7,910,411 B2
(45) Date of Patent: Mar. 22, 2011

(54) SEMICONDUCTOR DEVICE AND METHOD FOR MANUFACTURING THE SAME

(75) Inventor: Takeshi Miyajima, Anjo (JP)

(73) Assignee: DENSO CORPORATION, Kariya (JP)

( * ) Notice: Subject to any disclaimer, the term of this patent is extended or adjusted under 35 U.S.C. 154(b) by 660 days.

(21) Appl. No.: 12/003,870

(22) Filed: Jan. 3, 2008

(65) Prior Publication Data

US 2008/0173935 A1    Jul. 24, 2008

(30) Foreign Application Priority Data

Jan. 18, 2007  (JP) .................................. 2007-008920

(51) Int. Cl.
  H01L 21/329   (2006.01)
  H01L 21/04    (2006.01)
  H01L 29/866   (2006.01)

(52) U.S. Cl. . 438/140; 438/931; 438/983; 257/E21.356; 257/E21.054; 257/E21.541

(58) Field of Classification Search .................. 438/133, 438/140, 220, 931, 983; 257/110, 199, 106, 257/481, 551, 603, 506, E21.356, E21.351; 117/951
See application file for complete search history.

(56) References Cited

U.S. PATENT DOCUMENTS

| | | | |
|---|---|---|---|
| 5,463,978 A * | 11/1995 | Larkin et al. .................... | 117/89 |
| 6,639,260 B2 | 10/2003 | Suzuki et al. | |
| 6,825,565 B2 | 11/2004 | Onishi et al. | |
| 6,849,900 B2 | 2/2005 | Aida et al. | |
| 6,982,459 B2 | 1/2006 | Suzuki et al. | |
| 7,266,006 B2 * | 9/2007 | Kang ............................. | 365/145 |
| 7,317,213 B2 * | 1/2008 | Yamaguchi et al. .......... | 257/120 |
| 7,554,155 B2 * | 6/2009 | Saito et al. ..................... | 257/341 |
| 2002/0063259 A1 * | 5/2002 | Usui et al. ...................... | 257/110 |
| 2002/0167020 A1 * | 11/2002 | Iwamoto et al. .............. | 257/110 |
| 2003/0132450 A1 * | 7/2003 | Minato et al. ................. | 257/110 |
| 2006/0226499 A1 | 10/2006 | Shimizu | |
| 2008/0173935 A1 * | 7/2008 | Miyajima ..................... | 257/328 |

FOREIGN PATENT DOCUMENTS

| | | |
|---|---|---|
| JP | A-8-088354 | 4/1996 |
| JP | A-10-163482 | 6/1998 |
| JP | A-2003-174165 | 6/2003 |
| JP | A-2003-188381 | 7/2003 |
| JP | A-2004-146689 | 5/2004 |
| JP | A-2005-197497 | 7/2005 |

* cited by examiner

Primary Examiner — David Vu
Assistant Examiner — Earl N Taylor
(74) Attorney, Agent, or Firm — Posz Law Group, PLC

(57) ABSTRACT

A semiconductor device includes a semiconductor substrate, a cell region, an outer peripheral region, a field plate, an outermost peripheral ring, outer peripheral region layer, an insulator film, and a Zener diode. The semiconductor substrate has a superjunction structure. The outer peripheral region is disposed at an outer periphery of the cell region. The Zener diode is disposed on the insulator film for electrically connecting the field plate with the outermost peripheral ring. The Zener diode has a first conductivity type region and a second conductivity type region that are alternately arranged in a direction from the cell region to the outer peripheral region.

4 Claims, 7 Drawing Sheets

SEMICONDUCTOR DEVICE AND METHOD FOR MANUFACTURING THE SAME

CROSS REFERENCE TO RELATED APPLICATION

This application is based on and incorporates herein by reference Japanese Patent Application No. 2007-8920 filed on Jan. 18, 2007.

BACKGROUND OF THE INVENTION

1. Field of the Invention

The present invention relates to a semiconductor device that includes a cell region having a semiconductor chip and an outer peripheral region provided around the cell region. Also, the present invention relates to a method for manufacturing the semiconductor device.

2. Description of Related Art

Conventionally, for example, JP-A-2002-184985 corresponding to U.S. Pat. No. 6,982,459 has described a semiconductor device having a peripheral region (for high voltage use) provided at an outer peripheral region of a superjunction element. Specifically, JP-A-2002-184985 describes the semiconductor device, which has a silicon substrate having a superjunction structure portion. The superjunction structure portion has P type silicon single crystal regions and N type silicon single crystal regions alternately arranged along a surface of the silicon substrate. Also, the semiconductor device further has a cell region and an outer peripheral region that are provided on the silicon substrate. Multiple longitudinal semiconductor chips are formed on the cell region, and the outer peripheral region is provided around the cell region.

In the outer peripheral region of the above semiconductor device, an electric field is remarkably increased on a vicinity of a field plate end portion of the outer peripheral region. As a result, breakdown voltage may degrade. Thus, another superjunction structure other than the superjunction structure of the cell region is formed on the outer peripheral region to reduce the electric field on the outer peripheral region such that the degradation of the breakdown voltage at the outer peripheral region can be avoided.

However, in the above technique, different superjunction structures have to be formed on the silicon substrates of the cell region and the outer peripheral region. Thus, a superjunction structure in accordance with a shape and a size of each semiconductor chip has to be formed for the cell region and the outer peripheral region. As a result, a common substrate that can be used without consideration of the shape and size of the semiconductor chip has not been prepared. Thus, flexibility in usage of the substrate having the superjunction structure has not been fully achieved, and a substrate dedicated to each semiconductor chip has been used inevitably.

Thus, a common pn column structure may be used or shared by the cell region and the outer peripheral structure portion. FIG. 8 shows a cross section of a silicon substrate having a common superjunction structure shared by the cell region and the outer peripheral region. Thus, a silicon substrate 30 is provided with a superjunction structure 31, and a cell region 32 and an outer peripheral region 33 are provided to the substrate 30.

A field plate 34 is formed on the cell region 32 side of the outer peripheral region 33 of the substrate 30 as an electrode portion, and an insulator film 35 is formed on a front face of the outer peripheral region 33. Also, a drain electrode 36 is formed on a back face of the substrate 30. In a semiconductor device having the above structure, for example, in a case of n-channel MOSFET, a positive voltage is applied to a drain 36 relative to a source electrode, a depletion layer emerges as shown by a dashed line in FIG. 8.

In the above semiconductor device, inventors performed simulation of an electric field distribution. FIG. 9 shows a result of the simulation. When a voltage (potential) is distributed at high voltage in a direction from the cell region 32 to the outer peripheral region 33, as shown in FIG. 9, an electric field is high mostly on an end portion of the field plate 34 in the substrate 30. The above distribution is caused by the superjunction structure 31 that is shared by the cell region 32 and the outer peripheral region 33.

As above, when the superjunction structure 31, which is common in the substrate 30, is formed, breakdown voltage may not be sufficiently achieved in the outer peripheral region 33, and thereby breakdown voltage by a semiconductor device degrades.

SUMMARY OF THE INVENTION

The present invention is made in view of the above disadvantages. Thus, it is an objective of the present invention to address at least one of the above disadvantages.

To achieve the objective of the present invention, there is provided a semiconductor device, which includes a semiconductor substrate, a cell region, an outer peripheral region, a field plate, an outermost peripheral ring, outer peripheral region layer, an insulator film, and a Zener diode. The semiconductor substrate that includes a first conductivity type layer, a plurality of first conductivity type column regions, and a plurality of second conductivity type column regions. The plurality of first conductivity type column regions is disposed on the first conductivity type layer for serving as a drift region. The plurality of second conductivity type column regions is disposed on the first conductivity type layer for serving as the drift region. The semiconductor substrate has a repetition structure, in which the plurality of first conductivity type column regions and the plurality of second conductivity type column regions are repeatedly arranged along a surface of the first conductivity type layer. The cell region is disposed on the semiconductor substrate, and the cell region has a semiconductor chip. The outer peripheral region is disposed on the semiconductor substrate at an outer periphery of the cell region. The field plate is disposed to the semiconductor substrate on a cell region side of the outer peripheral region. The outermost peripheral ring is disposed at an outermost edge portion of the outer peripheral region, and the outermost peripheral ring is electrically connected with the semiconductor substrate. The outer peripheral region layer is disposed on the repetition structure. The insulator film is disposed on the outer peripheral region layer. The Zener diode is disposed on the insulator film for electrically connecting the field plate with the outermost peripheral ring. The Zener diode has a first conductivity type region and a second conductivity type region that are alternately arranged in a direction from the cell region to the outer peripheral region.

To achieve the objective of the present invention, there is also provided a semiconductor device, which includes a semiconductor substrate, a cell region, an outer peripheral region, a field plate, an outermost peripheral ring, outer peripheral region layer, an insulator film, and a Zener diode. The semiconductor substrate that includes a first conductivity type layer, a plurality of first conductivity type column regions, and a plurality of second conductivity type column regions. The plurality of first conductivity type column regions is disposed on the first conductivity type layer for serving as a drift region. The plurality of second conductivity type column regions is disposed on the first conductivity type layer for serving as the drift region. The semiconductor substrate has a repetition structure, in which the plurality of first conductivity type column regions and the plurality of second conductivity type column regions are repeatedly arranged along a surface of the first conductivity type layer. The cell region is disposed on the semiconductor substrate, and the cell region has a semiconductor chip. The outer peripheral region is disposed on the semiconductor substrate at an outer periphery of the cell region. The field plate is disposed to the semiconductor substrate on a cell region side of the outer peripheral region. The outermost peripheral ring is disposed at an outermost edge portion of the outer peripheral region, and the outermost peripheral ring is electrically connected with the semiconductor substrate. The outer peripheral region layer is disposed on the repetition structure. The insulator film is disposed on the outer peripheral region layer. The Zener diode is disposed on the insulator film for electrically connecting the field plate with the outermost peripheral ring, and the Zener diode has a first conductivity type region and a second conductivity type region that are alternately arranged along the outer periphery of the cell region.

To achieve the objective of the present invention, there is also provided a semiconductor device, which includes a semiconductor substrate, a cell region, an outer peripheral region, a field plate, an outermost peripheral ring, outer peripheral region layer, an insulator film, and a Zener diode. The cell region is disposed on the semiconductor substrate, and the cell region has a semiconductor chip. The outer peripheral region is disposed on the semiconductor substrate at an outer periphery of the cell region. The field plate is disposed to the semiconductor substrate on a cell region side of the outer peripheral region. The outermost peripheral ring is disposed at an outermost edge portion of the outer peripheral region, and the outermost peripheral ring is electrically connected with the semiconductor substrate. The outer peripheral region layer is disposed on a surface portion of the outer peripheral region. The insulator film is disposed on the outer peripheral region layer. The Zener diode is disposed on the insulator film for electrically connecting the field plate with the outermost peripheral ring. The Zener diode has a first conductivity type region and a second conductivity type region that are alternately arranged in a direction from the cell region to the outer peripheral region.

To achieve the objective of the present invention, there is also provided a semiconductor device, which includes a semiconductor substrate, a cell region, an outer peripheral region, a field plate, an outermost peripheral ring, outer peripheral region layer, an insulator film, and a Zener diode. The cell region is disposed on the semiconductor substrate, and the cell region has a semiconductor chip. The outer peripheral region is disposed on the semiconductor substrate at an outer periphery of the cell region. The field plate is disposed to the semiconductor substrate on a cell region side of the outer peripheral region. The outermost peripheral ring is disposed at an outermost edge portion of the outer peripheral region, and the outermost peripheral ring is electrically connected with the semiconductor substrate. The outer peripheral region layer is disposed on a surface portion of outer peripheral region. The insulator film is disposed on the outer peripheral region layer. The Zener diode is disposed on the insulator film for electrically connecting the field plate with the outermost peripheral ring, and the Zener diode has a first conductivity type region and a second conductivity type region that are alternately arranged along the outer periphery of the cell region. The Zener diode is made of a wide band gap material.

To achieve the objective of the present invention, there is also provided a method for manufacturing a semiconductor device. In the method, an outer peripheral region is formed on a semiconductor substrate of the semiconductor device at an outer periphery of a cell region. A Zener diode is formed to the outer peripheral region. The forming of the Zener diode includes forming the Zener diode using a wide band gap material at a temperature of equal to or lower than 700° C.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF PREFERRED EMBODIMENTS

Embodiments of the present invention will be described with reference to accompanying drawings. It is note that similar components of each of the embodiments similar to each other are indicated by the same numeral in the description and drawings.

First Embodiment

The first embodiment of the present invention will be described. A semiconductor device of the present embodiment may be applied to any of power semiconductor devices, for example, MOSFET, IGBT. It is noted that "N type" of the present embodiment corresponds to "first conductivity type" of the present invention and "P type" of the present embodiment corresponds to "second conductivity type" of the present invention.

Figure 1:
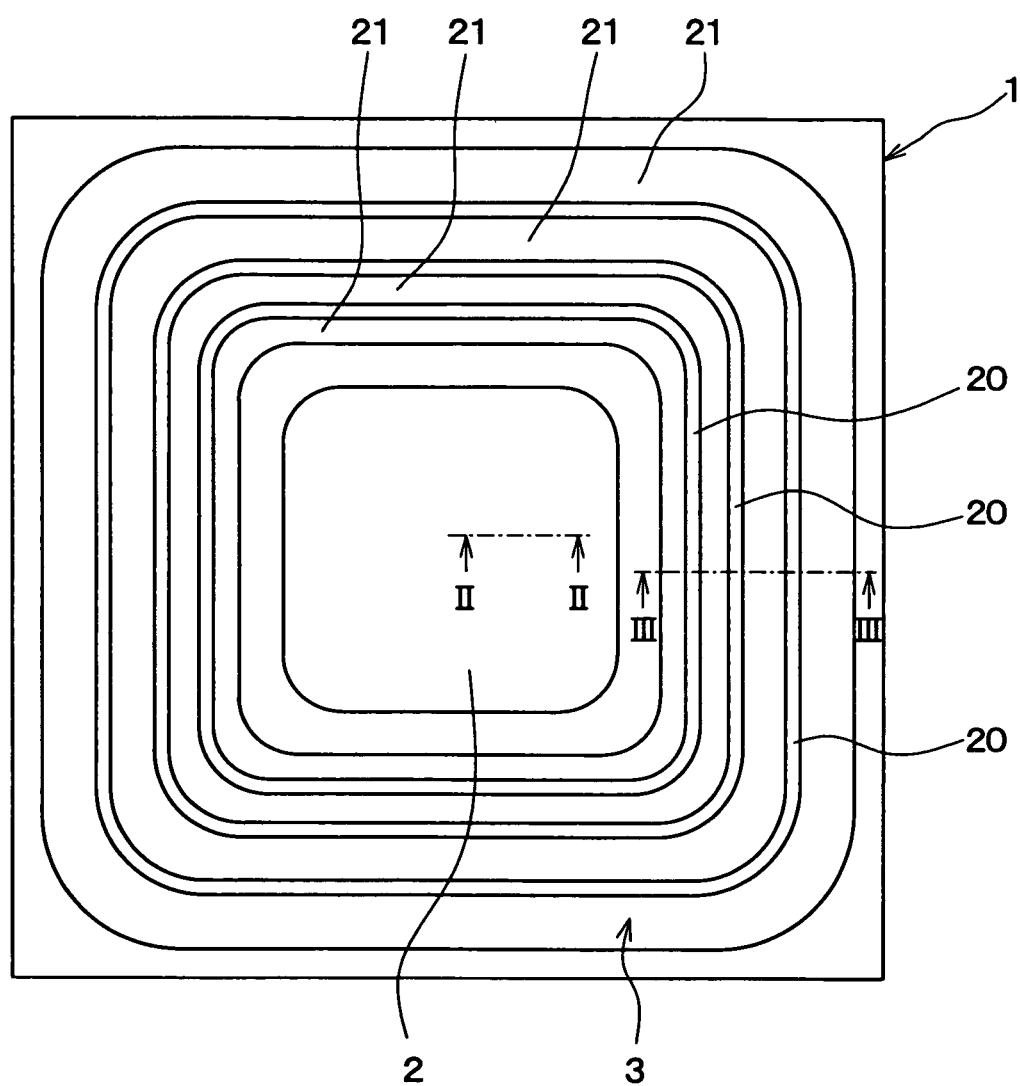
FIG. 1 is a plan view of a semiconductor device according to a first embodiment of the present invention.

FIG. 1 is a plan view of a semiconductor device according to the first embodiment of the present invention. As shown in FIG. 1, a semiconductor device 1 includes a cell region 2 and an outer peripheral region 3. The cell region 2 has a semiconductor chip and is has a rectangular shape. The outer peripheral region 3 is provided at an outer periphery of the cell region 2 to surround the cell region 2.

Figure 2:
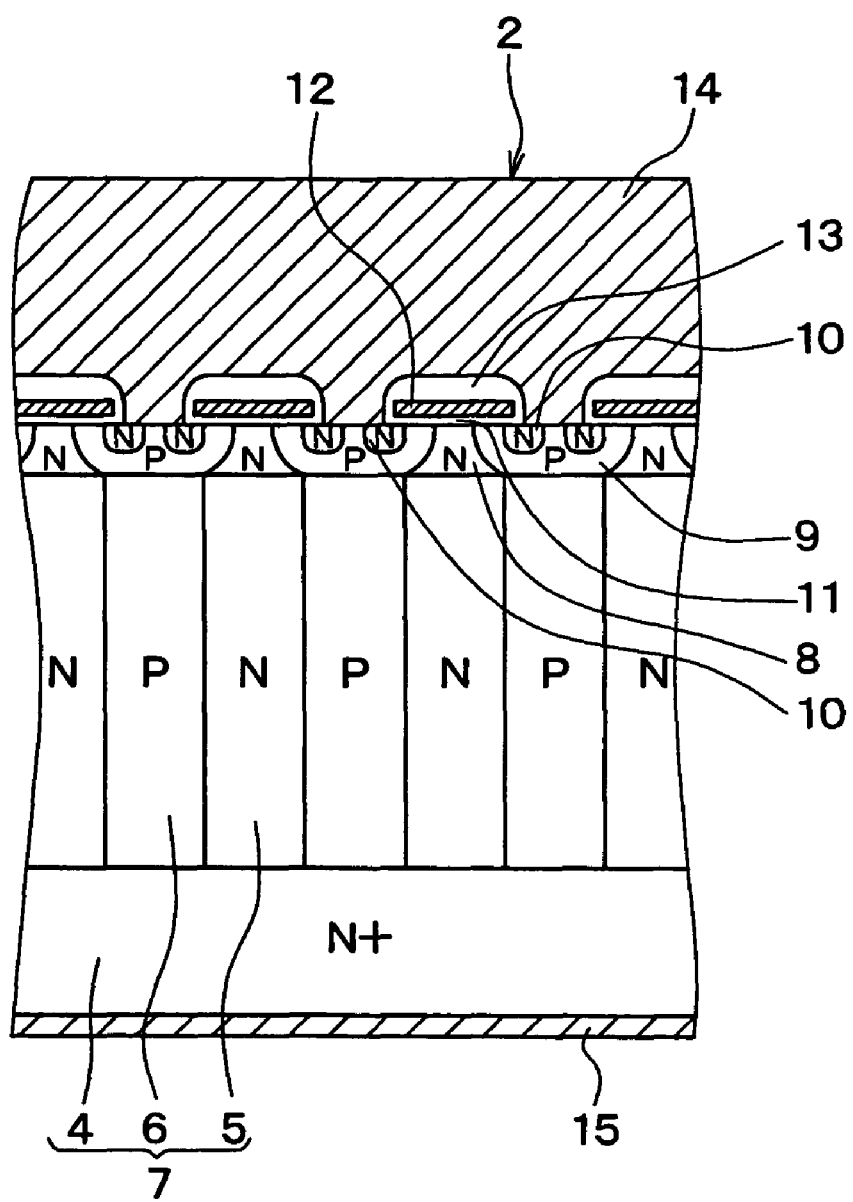
FIG. 2 is a cross-sectional view of a cell region taken along line II-II of FIG. 1.

FIG. 2 is a cross-sectional view taken along line II-II of FIG. 1 for showing a cross section of the cell region 2. As shown in FIG. 2, the cell region 2 includes multiple MOSFETs. Firstly, N type column regions 5 and P type column regions 6 are formed as a drift region on N+ type layer 4. Also, the N type column regions 5 and the P type column regions 6 are alternately arranged along a plane of the N+ type layer 4 to form a superjunction structure. In other words, the semiconductor device 1 shown in FIG. 2 has a structure, in which the P type column regions 6 and the N type column regions 5 are repeatedly provided.

The present embodiment employs a semiconductor substrate that has columns of the N type column regions 5 and columns of the P type column regions 6, which are repeatedly formed on the N+ type layer 4. The cell region 2 and the outer peripheral region 3 are formed on the semiconductor substrate to form the semiconductor device 1. The N+ type layer 4, each column of the N type column regions 5, and each column of the P type column regions 6 constitute a superjunction substrate 7, which serves as a semiconductor substrate.

Note that the N+ type layer 4 corresponds to a first conductivity type layer of the present invention. Also, the N type column region 5 corresponds to a first conductivity type column region of the present invention, and the P type column region 6 corresponds to a second conductivity type column region of the present invention.

As shown in FIG. 2, at the cell region 2, an N type neck region 8 is provided on a surface portion of each of the N type column regions 5, and a P type channel region 9 is provided on a surface portion of each of the P type column regions 6. N type source regions 10 are provided to be separate apart from each other at a surface portion of the P type channel regions 9. Also, a gate oxide film 11 is provided on the N type source regions 10, the P type channel region 9, and N type neck region 8, and a gate electrode 12 is provided on the gate oxide film 11. Further, an insulator film 13 is provided to cover the gate electrode 12.

A front face electrode 14 is provided to connect with uncovered parts of the N type source regions 10 and of the P type channel regions 9, and to cover the insulator film 13. Also, the N+ type layer 4 has a back face electrode 15 that contacts with the N+ type layer 4.

Figure 3:
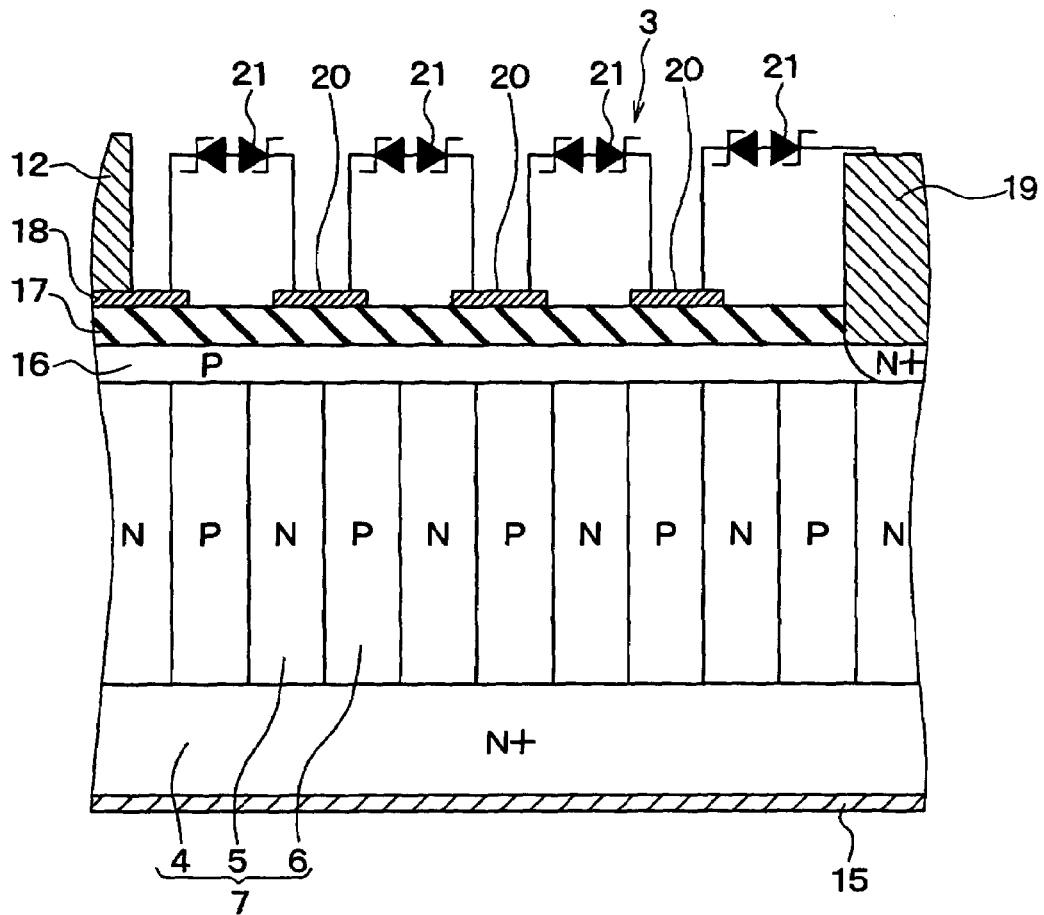
FIG. 3 is a cross-sectional view of an outer peripheral region taken along line III-III of FIG. 1.

FIG. 3 is a cross-sectional view taken along line III-III of FIG. 1, and shows a cross section of the outer peripheral region 3. As shown in FIG. 3, at the outer peripheral region 3, a P type layer 16 is formed on the superjunction substrate 7, and an insulator film (i.e., an electrical insulation film) 17 is formed on the P type layer 16. Also, the field plate 18 is provided on a cell region side of the outer peripheral region 3 (i.e., on a side of the outer peripheral region 3 toward the cell region 2), and the gate electrode 12 is provided on the field plate 18. Note that the P type layer 16 corresponds to an outer peripheral region layer of the present invention.

Also, an equipotential ring (EQR) 19 serving as an outermost peripheral ring is formed at a side of the insulator film 17 toward an outer edge side of the semiconductor device 1. In other words, the equipotential ring 19 is provided at an outermost edge portion of the outer peripheral region 3. Typically, the equipotential ring 19 is provided at a side of the outer peripheral region 3 away from the cell region 2. The equipotential ring 19 is electrically connected with the superjunction substrate 7 through the N+ type region.

Furthermore, multiple rings 20 are provided on the insulator film 17. Typically, each of the rings 20 is provided to surround the cell region 2 as shown in FIG. 1 as a conductive region. For example, N type conductive region, P type conductive region, or a metal may be employed as the ring 20.

The rings 20 are mutually connected through Zener diodes 21. In the present embodiment, each of the Zener diodes 21 is arranged as shown in FIG. 3 such that the potential contour lines are regularly distributed at the edge of the semiconductor device 1 in an outward direction of the semiconductor device 1, and thereby the electric field is relaxed in the semiconductor device 1. The Zener diode 21 is made of polycrystalline silicon, for example. Thus, the Zener diode 21 can be formed easily at the outer peripheral region 3. Note that, the Zener diode 21 may be alternatively made of microcrystalline silicon.

Figure 4:
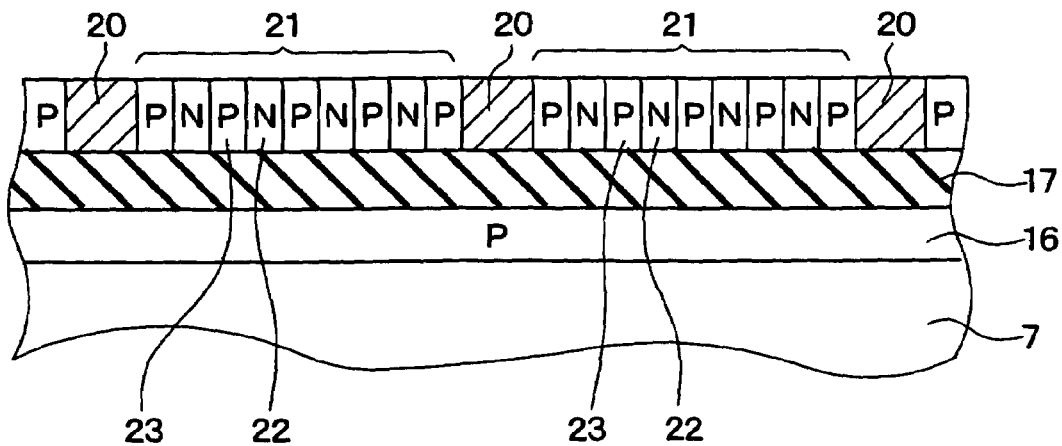
FIG. 4 is a cross-sectional view of Zener diode shown in FIG. 3.

FIG. 4 is a specific cross-sectional view of the Zener diodes 21 shown in FIG. 3, and corresponds to a part of the cross-sectional view of the semiconductor device 1 taken along line III-III of FIG. 1. As shown in FIG. 4, N type regions 22 and P type regions 23 are alternately provided between the rings 20 to constitute the Zener diode 21. In other words, the N type regions 22 and the P type regions 23 are alternately provided between the rings 20 in a direction from the cell region 2 to the outer peripheral region 3, for example. The number of sections of the Zener diode 21 is determined depending on an environment, under which the semiconductor device 1 is used. The general configuration of the semiconductor device 1 according to the present embodiment has been described as above.

Next, a method for manufacturing the semiconductor device shown in FIG. 1 to FIG. 4 is described. Firstly, the superjunction substrate 7 is prepared. Then, although a diagram of a manufacturing process is not shown, the N type neck region 8 is formed on each of the N type column regions 5 of the superjunction substrate 7, which regions correspond to the cell region 2. Also, the P type channel region 9 is formed on each of the P type column regions 6 of the superjunction substrate 7 correspondingly to the cell region 2.

Then, the N type source regions 10 are formed to be separate from each other in each of the P type channel regions 9, and a gate oxide film 11 is formed to cover the N type source region 10, the P type channel regions 9, and the N type neck region 8 as shown in FIG. 2. Then, the gate electrode 12 is formed on the gate oxide film 11, and the insulator film 13 is formed to cover the gate electrode 12. Then, the front face electrode 14 is formed to cover the N type source regions 10, the P type channel regions 9, and the insulator films 13 to complete the formation of the cell region 2.

Also, the P type layer 16 is formed on the superjunction substrate 7 at an outer periphery of the cell region 2. Then, the insulator film 17 is formed on the P type layer 16. The insulator film 17 has a thickness larger than a thickness of the gate oxide film 11 of the cell region 2.

Then, the field plate 18 is formed on the side of the outer peripheral region 3 toward the cell region 2, and the gate electrode 12 is formed on the field plate 18 when the gate electrode 12 of the cell region 2 is formed. Also, the equipotential ring 19 is formed at the outermost edge portion of the outer peripheral region 3. The Zener diodes 21 and the multiple rings 20 are formed between the gate electrode 12 and the equipotential ring 19 in the outer peripheral region 3. In this way, the semiconductor device 1 shown in FIG. 1 to FIG. 4 is completed.

In the semiconductor device 1, an electric field of the outer peripheral region 3 is mitigated as follows. When MOSFETs of the cell region 2 are driven and a positive voltage is applied to the drain relative to the source, an electric field is increased at an end portion of the field plate 18 shown in FIG. 3. However, as shown in FIG. 4, the Zener diode 21, which has the P type regions 23 and the N type regions 22 alternately arranged between the rings 20, appropriately distributes and fixes (holds) the potential (voltage) in a direction from the cell region 2 to the outer peripheral region 3, the potential being generated on the surface of the superjunction substrate 7. As a result, the electric field on the end portion of the field plate 18 is decreased, and the high breakdown voltage of the outer peripheral region 3 can be substantially achieved.

As described above, the present embodiment is characterized by the Zener diode 21, which is provided to the outer peripheral region 3 of the semiconductor device 1 having the superjunction substrate 7, and which has the N type regions 22 and the P type regions 23 alternately arranged on the surface of the superjunction substrate 7 in the direction from the cell region 2 to the outer peripheral region 3.

The above configuration distributes and fixes the electric field that may otherwise be increased on the end portion on a side of the field plate 18 toward the outer peripheral region 3 (i.e., the end portion of the field plate 18 on the outer peripheral region 3 side of the field plate 18). Therefore, the electric field is on the end portion of the field plate 18 in the superjunction substrate 7 is decreased. As a result, the high breakdown voltage of the outer peripheral region 3 can be achieved.

Also, in the semiconductor device 1, a substrate structure dedicated to the outer peripheral region 3 is not required to be formed. As a result, the superjunction substrate 7 can be shared by (i.e., can be commonly used by) the cell region 2 and the outer peripheral region 3. Thus, a superjunction structure in accordance with a shape and a size of each semiconductor chip is not required to be provided individually to the cell region 2 and the outer peripheral region 3 in order to constitute the semiconductor device 1.

Second Embodiment

The present embodiment is described focusing only on a part different from the first embodiment. In the first embodiment, the Zener diode 21 is provided at the entire of the outer periphery of the cell region 2. However, in the present embodiment, the Zener diodes 21 are formed at only parts of the outer periphery of the cell region 2.

Figure 5:
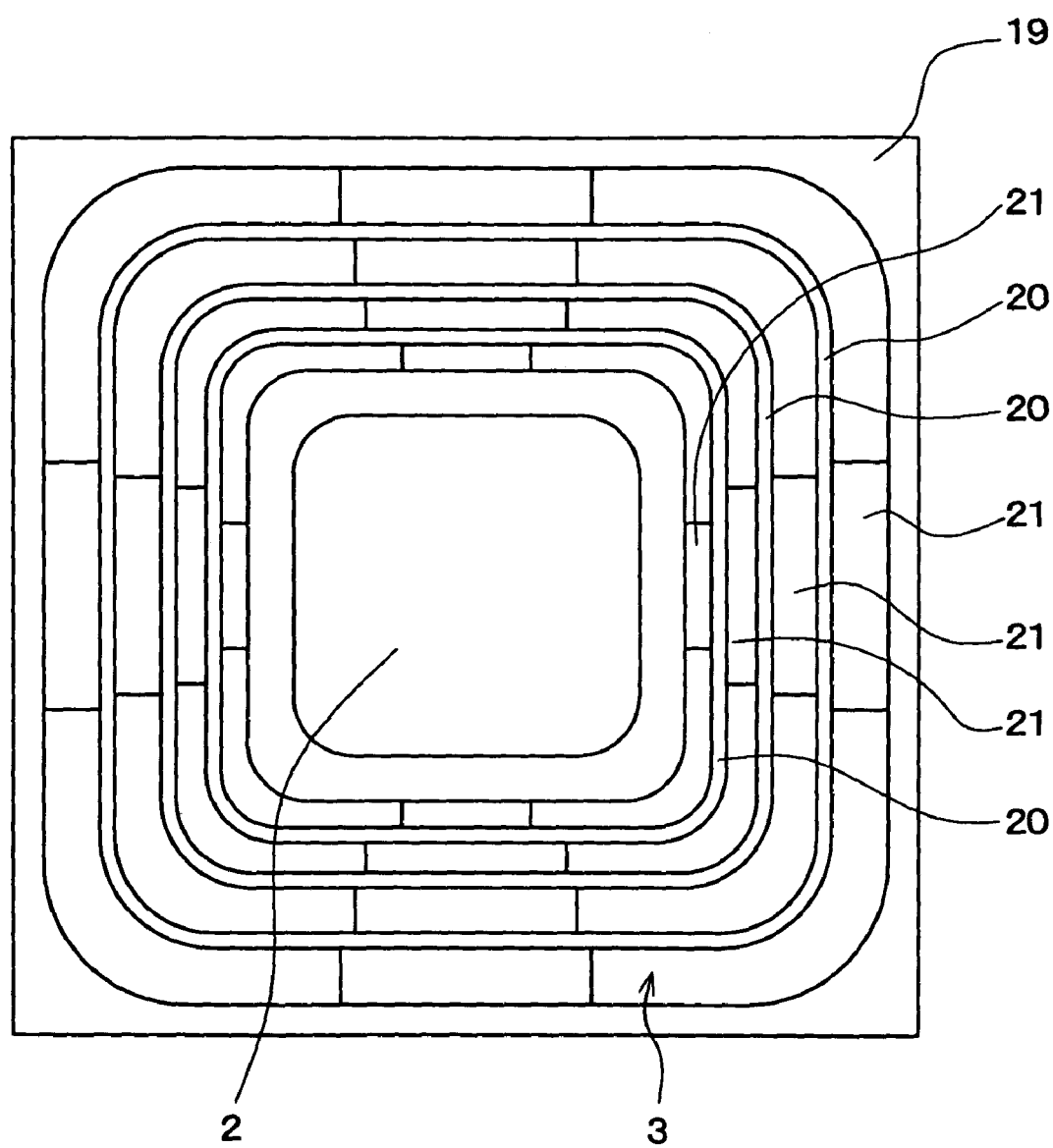
FIG. 5 is a plan view of a semiconductor device according to a second embodiment of the present invention.

FIG. 5 is a plan view of a semiconductor device according to the second embodiment. As shown in FIG. 5, in the outer peripheral region 3, the Zener diodes 21, which are formed in parts, provide connection between the ring 20 and the field plate 18. Also, the Zener diodes 21 provides connection among the rings 20, and between the ring 20 and the equipotential ring 19.

In this way, by forming the Zener diode 21 in parts at the outer peripheral region 3, junction areas between the N type regions 22 and the P type regions 23, which regions constitute the Zener diode 21, can be reduced. As a result, even in a case, where the Zener diode 21 is made of the polycrystalline silicon (polycrystalline Si), leakage of the electric current of the Zener diode 21 at high temperature can be reduced.

Third Embodiment

In the third embodiment, only a part different from the first and second embodiments is described. In the each of the above embodiments, the N type regions 22 and the P type regions 23 are alternately and multiply arranged at the outer peripheral region 3 in the outward direction of the semiconductor device 1, that is, in the direction from the cell region 2 to the outer peripheral region 3, to form the Zener diode 21. However, in the third embodiment, a Zener diode is formed by arranging the N type regions 22 and the P type regions 23 in a direction along the outer periphery of the cell region 2.

Figure 6:
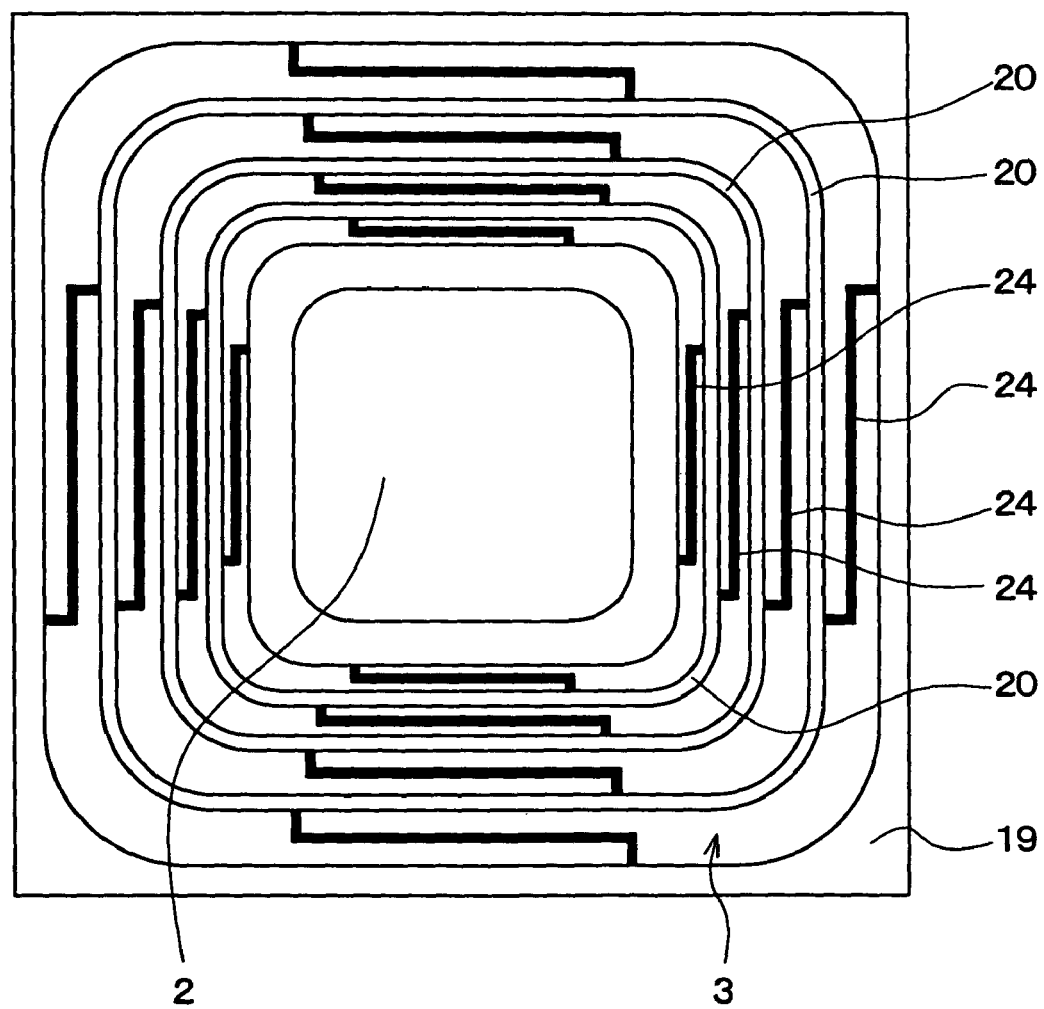
FIG. 6 is a plan view of a semiconductor device according to a third embodiment of the present invention.

FIG. 6 is a plan view of a semiconductor device according to the present embodiment. As shown in FIG. 6, in the outer peripheral region 3, Zener diodes 24 provides connection between the ring 20 and the field plate 18, among the ring 20, and between the ring 20 and the equipotential ring 19. Here, each of the Zener diodes 24 has the N type regions 22 and the P type regions 23 that are repeatedly formed in the direction along the ring 20.

By forming the Zener diodes 24 as above, a distance between the rings 20 can be reduced. Also, the number of sections (i.e., regions) of the N type regions 22 and the P type regions 23, which constitute each Zener diode 24, can be increased in the present embodiment relative to a case, where the N type regions 22 and the P type regions 23 are formed in the direction from the cell region 2 to the outer peripheral region 3. As a result, the potential (voltage) between the rings 20 can be more precisely controlled based on the above number of sections.

Fourth Embodiment

In the fourth embodiment, only a part different from the third embodiment is described. In the above second embodiment, each of the rings 20 goes around the outer periphery of the cell region 2. However, in the present embodiment, each ring does not go around the outer periphery of the cell region 2, and is connected with an end portion of each Zener diode 24. Specific configuration is described below.

Figure 7:
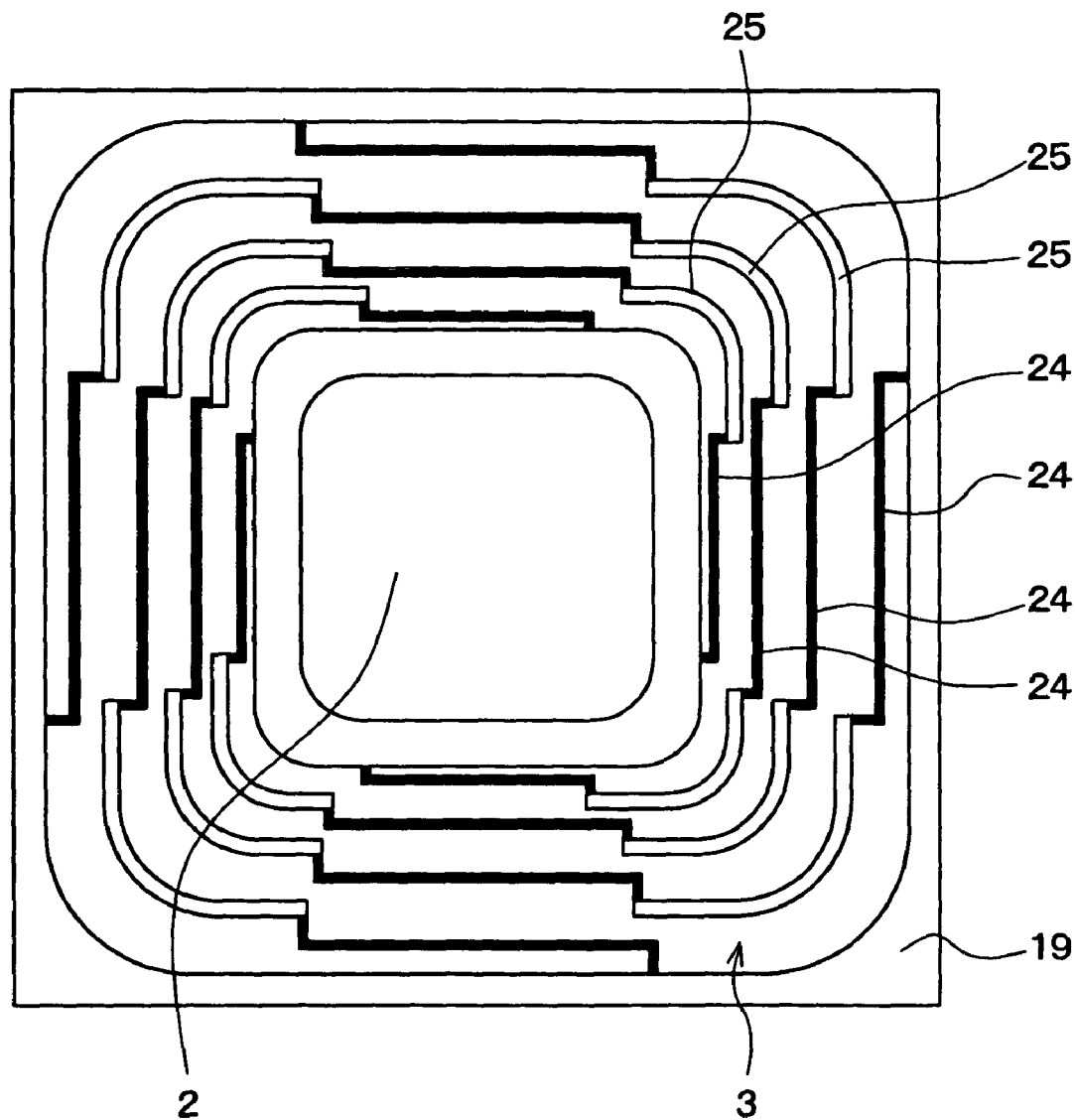
FIG. 7 is a plan view of a semiconductor device according to a fourth embodiment of the present invention.
Figure 8:
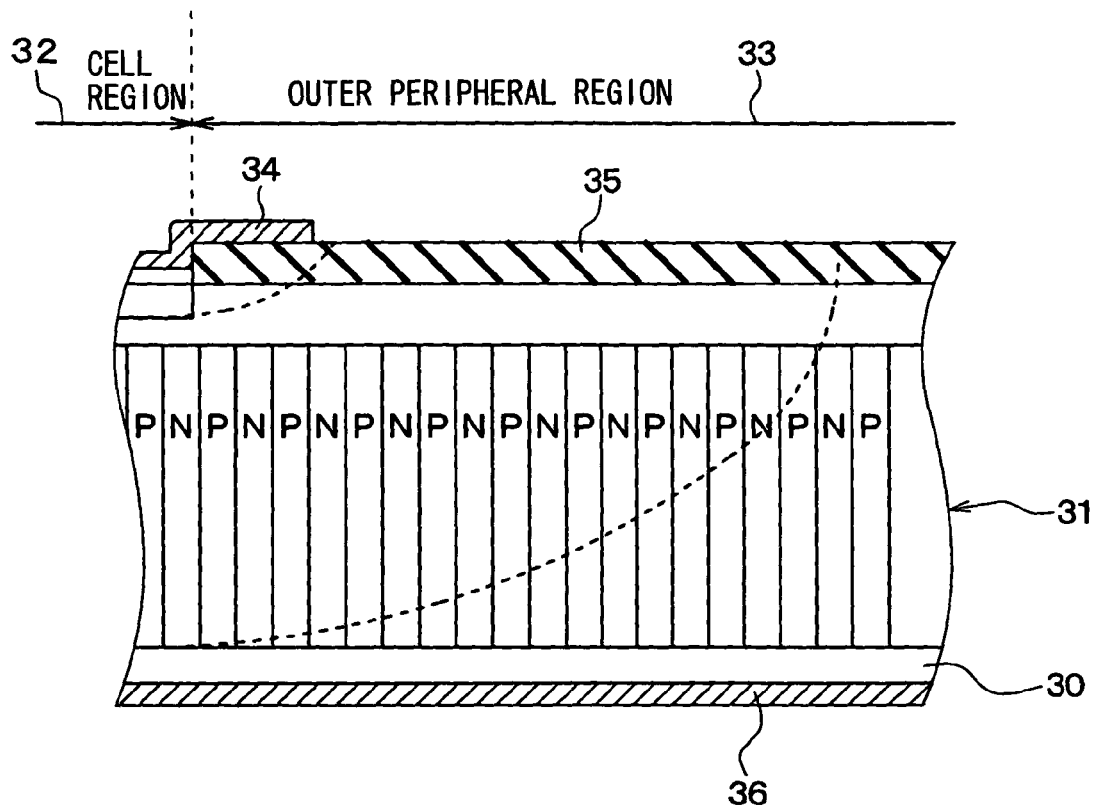
FIG. 8 is a cross-sectional view of a silicon substrate of a conventional semiconductor device, and the silicon substrate having a common superjunction structure shared by a cell region and an outer peripheral region.
Figure 9:
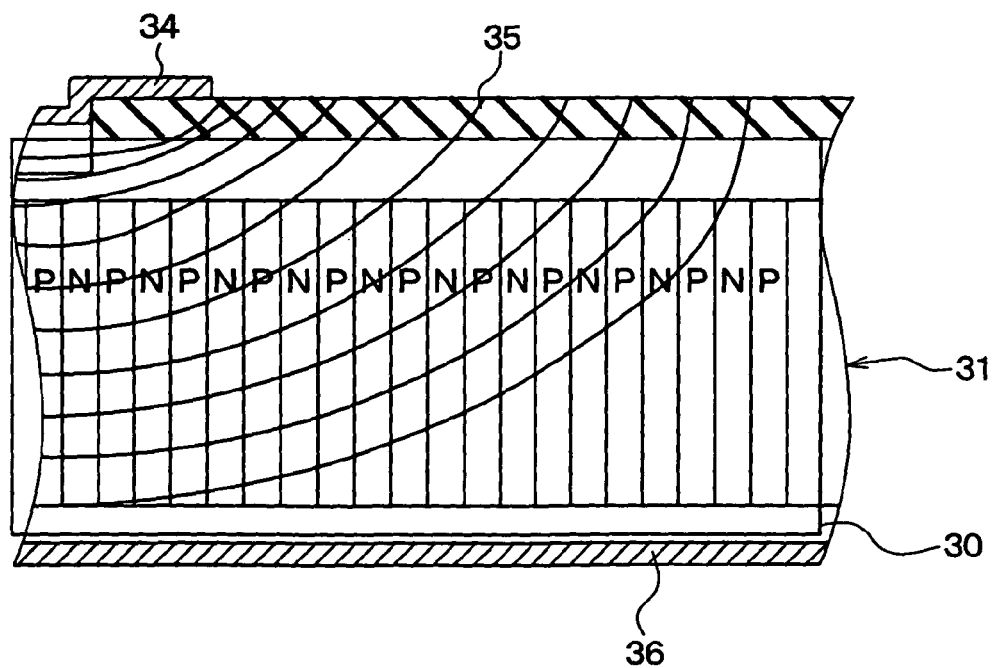
FIG. 9 is a diagram showing a simulation result of an electric potential distribution according to the conventional semiconductor device.

FIG. 7 is a plan view of according to the present embodiment semiconductor device. As shown in FIG. 7, each Zener diode 24 is provided in a direction, in which each ring 25 (e.g., ring segment) extends. Also, each Zener diode 24 has both end portions connected with the corresponding ring 25.

As a result, in the outer peripheral region 3, one end of the Zener diode 24 is connected with the cell region 2, and the other end of the Zener diode 24 is connected with one end of the ring 25. Also, the ring 25 has the other end that is connected with one end of another Zener diode 24, which is provided one row outwardly of the Zener diode 24 provided closest to the cell region 2. The above connection configuration is repeated at the outer periphery of the cell region 2, and the Zener diode 24 provided closest to the equipotential ring 19 in the outer peripheral region 3 is connected with the equipotential ring 19.

As described above, the ring 25 and the Zener diode 24 are arranged along the outer periphery of the cell region 2 for connection with each other to constitute the outer peripheral region 3.

Fifth Embodiment

In the fifth embodiment, only a part different from the first to fourth embodiments is described. In the above first to fourth embodiments, the Zener diodes 21, 24 provided at the outer peripheral region 3 of the semiconductor device 1 are made of polycrystalline silicon or of microcrystalline silicon. In the above case, when the semiconductor device 1 has high temperature, leakage of the electric current may be increased. Thus, typically, a high breakdown voltage element for more than or equal to 600 V, which element has the Zener diode 21, 24 with a large number of sections, may not be used at a substantially high temperature. The present embodiment is characterized by that each Zener diode 21, 24 is made of a wide band gap material.

Specifically, the Zener diode 21, 24 is made of polycrystalline silicon carbide (polycrystalline SiC). As a result, the leakage of the electric current of the Zener diode 21, 24 can be effectively reduced to almost zero, and an outer peripheral structure, which has high breakdown voltage for use in a high temperature, can be achieved. Also, because the Zener diode 21, 24 is made of polycrystalline silicon carbide, a film of SiC can be formed at equal to or less than e.g., 700° C. As a result, the Zener diode 21, 24 can be formed without widely changing the distribution of dopant (impurity) in Si.

In the present embodiment, when the Zener diode 21, 24 is formed, SiC as the wide band gap material is formed at a temperature of equal to or lower than 700° C. When SiC is formed at a temperature of higher than 700° C., the distribution of dopant in Si is widely changed. However, when SiC is formed at the temperature of equal to or lower than 700° C., dopants rarely move. The formation of the Zener diode 21, 24 employs an apparatus that can form a film at low temperature, and an ECR plasma CVD apparatus may be employed, for example. Note that, the formation of the Zener diode 21, 24 can be achieved at the temperature of equal to or lower than 700° C., and a lower limit of temperature for forming a film may be equal to or lower than a room temperature. The Zener diode 21, 24 is formed by performing ion implantation of p type dopant and by forming a p type dopant region through high temperature ion implantation and a lamp post-annealing after n type SiC has been formed, for example.

As described above, the Zener diode 21, 24 may be made of SiC that is the wide band gap material. In the above case, the polycrystalline silicon carbide (polycrystalline SiC) is formed such that the Zener diode 21, 24 is easily formed. Also, by making the Zener diode 21, 24 of polycrystalline SiC, the leakage of the electric current of the Zener diode 21, 24 can be limited to almost zero even at a high temperature of equal to or higher than 150° C. As a result, the semiconductor device 1 can be used at a high temperature of equal to or higher than 150° C., for example.

Sixth Embodiment

In the sixth embodiment, only a part different from the fifth embodiment is described. In the above fifth embodiment, polycrystalline SiC as the wide band gap material is employed to form the Zener diode 21, 24. The present embodiment is characterized in that the semiconductor device 1 can be applied to a normal power semiconductor device in a case, where polycrystalline SiC is employed to form the Zener diode 21, 24.

Typically, in the sixth embodiment, in the cell region 2, MOSFET shown in FIG. 2 is formed on a normal semiconductor substrate, but not on the superjunction substrate 7. In the above configuration, the Zener diode 21, 24 made of polycrystalline SiC is provided to the outer peripheral region 3.

In this way, in a case, where the cell region 2 and the outer peripheral region 3 are formed on the normal semiconductor substrate, which does not have the superjunction structure, to constitute the semiconductor device 1, the Zener diode 21, 24 can be made of polycrystalline SiC at the outer peripheral region 3.

Other Embodiment

The rings 20 and the rings 25 in each of the above embodiments may be made of metal, such as aluminium (Al). Also, the rings 20 and the rings 25 may be formed in the same process, in which the Zener diodes 21, 24 are formed, to simplify the entire process.

Also, in each of the above embodiments, the rings 20 or the rings 25 may be omitted. In other words, the Zener diode 21, 24 may provide connection between the field plate 18 and the equipotential ring 19.

In each of the above embodiments, a planar MOSFET is described as an example. However, a concave MOSFET or a trench MOSFET can achieve the advantages similar to the advantages of the planar MOSFET.

In the first embodiment, in the process of forming the semiconductor device 1, the Zener diode 21 may be made simultaneously with gate polycrystalline silicon, wire polycrystalline silicon, polycrystalline silicon Zener temperature sensor, which are formed at different parts on the semiconductor chip, such that steps in the process can be reduced. Also, if the Zener diode 21 is formed simultaneously in the process of forming the polycrystalline silicon Zener temperature sensor, the steps can be further reduced.

Additional advantages and modifications will readily occur to those skilled in the art. The invention in its broader terms is therefore not limited to the specific details, representative apparatus, and illustrative examples shown and described.

What is claimed is:

1. A method for manufacturing a semiconductor device, the method comprising:
    forming an outer peripheral region on a semiconductor substrate of the semiconductor device at an outer periphery of a cell region; and
    forming a Zener diode to the outer peripheral region, wherein:
    the forming of the Zener diode includes forming the Zener diode using a wide band gap material at a temperature of equal to or lower than 700° C.

2. The method according to claim 1, wherein:
    the cell region of the semiconductor device has a semiconductor chip;
    the semiconductor device further includes:
        a field plate that is disposed to the semiconductor substrate on a cell region side of the outer peripheral region;
        an outermost peripheral ring that is disposed at an outermost edge portion of the outer peripheral region, the outermost peripheral ring being electrically connected with the semiconductor substrate;
        an outer peripheral region layer that is disposed on a surface portion of the outer peripheral region; and
        an insulator film that is disposed on the outer peripheral region layer; and
    the Zener diode of the semiconductor device is disposed on the insulator film for electrically connecting the field plate with the outermost peripheral ring, the Zener diode having a first conductivity type region and a second conductivity type region that are alternately arranged in a direction from the cell region to the outer peripheral region, the first conductivity type region and the second conductivity type region being made of the wide band gap material.

3. The method according to claim 1, wherein:
    the cell region of the semiconductor device has a semiconductor chip;

the semiconductor device further includes:
- a field plate that is disposed to the semiconductor substrate on a cell region side of the outer peripheral region;
- an outermost peripheral ring that is disposed at an outermost edge portion of the outer peripheral region, the outermost peripheral ring being electrically connected with the semiconductor substrate;
- an outer peripheral region layer that is disposed on a surface portion of the outer peripheral region;
- an insulator film that is disposed on the outer peripheral region layer; and
- the Zener diode of the semiconductor device is disposed on the insulator film for electrically connecting the field plate with the outermost peripheral ring, the Zener diode having a first conductivity type region and a second conductivity type region that are alternately arranged in a direction along the outer periphery of the cell region, the first conductivity type region and the second conductivity type region being made of the wide band gap material.

4. The method according to claim 1, wherein the wide band gap material includes SiC.

* * * * *